US012724058B2

(12) United States Patent
Hayes

(10) Patent No.: US 12,724,058 B2
(45) Date of Patent: Sep. 1, 2026

(54) PARALLEL FEEDERS FOR CONTINUED OPERATION

(71) Applicant: Hamilton Sundstrand Corporation, Charlotte, NC (US)

(72) Inventor: Tyler W. Hayes, Rockford, IL (US)

(73) Assignee: Hamilton Sundstrand Corporation, Charlotte, NC (US)

( * ) Notice: Subject to any disclaimer, the term of this patent is extended or adjusted under 35 U.S.C. 154(b) by 217 days.

(21) Appl. No.: 18/122,911

(22) Filed: Mar. 17, 2023

(65) Prior Publication Data

US 2024/0310424 A1 Sep. 19, 2024

(51) Int. Cl.
*G01R 31/08* (2020.01)
*H02J 3/36* (2026.01)

(52) U.S. Cl.
CPC .............. *G01R 31/086* (2013.01); *H02J 3/36* (2013.01)

(58) Field of Classification Search
CPC ...... G01R 31/086; H02J 3/36; H02J 2310/44; H02J 1/14; H02J 1/08; H02H 7/268
See application file for complete search history.

(56) References Cited

U.S. PATENT DOCUMENTS 5,488,532 A 1/1996 Mrowiec et al.
8,760,094 B2 * 6/2014 Solodovnik ............. H02P 1/021 318/71
9,197,056 B2 11/2015 Liu et al.
9,525,291 B1 12/2016 Huynh et al.
9,787,101 B2 10/2017 DiVito et al.
10,184,452 B2 * 1/2019 Tahata ..................... H02H 3/18
10,543,928 B2 1/2020 Demelas
10,965,125 B2 3/2021 White
11,177,648 B2 11/2021 Li et al.
11,358,473 B2 6/2022 Sheffield et al.
2003/0047997 A1 * 3/2003 Bernier .................. B64D 41/00 307/9.1
2012/0232728 A1 * 9/2012 Karimi ...................... H02J 3/38 180/65.265
2013/0076120 A1 * 3/2013 Wagner ................... F01D 15/10 307/9.1
2016/0122033 A1 * 5/2016 Liffring ..................... H02J 3/00 307/9.1
2018/0013280 A1 * 1/2018 Barker ................... H02H 7/262
2018/0339790 A1 * 11/2018 Huang .................... H02J 3/381
2019/0013679 A1 * 1/2019 Radun ....................... H02J 4/00

(Continued)

FOREIGN PATENT DOCUMENTS

FR 3095422 A1 10/2020

OTHER PUBLICATIONS

European Search Report dated Aug. 6, 2024 in connection with European Patent Application No. 24163678.6, 9 pages.

*Primary Examiner* — Eman A Alkafawi
*Assistant Examiner* — Dilara Sultana

(57) ABSTRACT

A system includes four high voltage direct current (HVDC) feeders, each having a first contactor configured for selectively connecting a positive terminal of an HVDC source to the respective HVDC feeder, and having a second contactor configured for selectively connecting the respective HVDC feeder to an HVDC bus. A power converter can be configured to use feedback to locate a fault when a fault arises, and to isolate the fault by opening of the contactors as needed for continued operation of as many of the HVDC feeders as possible after clearing the fault.

20 Claims, 2 Drawing Sheets

(56) References Cited

U.S. PATENT DOCUMENTS

| | | | | |
|---|---|---|---|---|
| 2020/0021111 | A1* | 1/2020 | White | H02J 3/0012 |
| 2021/0281074 | A1 | 9/2021 | Joyce et al. | |
| 2022/0094297 | A1* | 3/2022 | Lacaux | H02P 3/22 |
| 2022/0115878 | A1* | 4/2022 | Khozikov | B60L 3/0046 |
| 2022/0255335 | A1 | 8/2022 | Khozikov et al. | |
| 2022/0341983 | A1* | 10/2022 | Foch | G01R 31/52 |
| 2022/0402364 | A1 | 12/2022 | Khozikov et al. | |

* cited by examiner

PARALLEL FEEDERS FOR CONTINUED OPERATION

BACKGROUND

1. Field

The present disclosure relates to power handling, and more particularly to DC feeders such as used to connect between batteries and power converters for electric machines, e.g. in electric or hybrid electric aircraft.

2. Description of Related Art

More electric, hybrid electric, and fully electric aircraft designs require HVDC (high voltage DC) to be distributed to various products throughout the aircraft. HVDC utilized on existing more electric aircraft to date typically is regulated to +/−270 VDC, whereas more traditional aircraft electrical systems operated with VAC or low voltage DC at 28 V DC. The HVDC distribution in an aircraft can take place within multiple areas of the aircraft, including but not limited to the fuselage and through the wings, which has a large beneficial impact on aircraft weight. Some electric propulsion applications use an electric machine to supplement a thermal engine or directly motor a fan or propeller for improved engine performance or thrust. This typically requires high torque/current operation. In some designs, the same electric machine used for motoring can also be used as a generator when the machine is not needed for engine operability. The generator mode typically requires less torque/current than required for motor operation. Typically, two positive and negative HVDC feeds connect a battery or DC bus to power handling electronics of the motor/generator.

The conventional techniques have been considered satisfactory for their intended purpose. However, there is an ever present need for improved systems and methods for power handling in DC feeders such as in more electric, hybrid electric, and fully electric aircraft. This disclosure provides a solution for this need.

SUMMARY

A system includes a first high voltage direct current (HVDC) feeder connected to a first contactor configured for selectively connecting a positive terminal of an HVDC source to the first HVDC feeder. The first HVDC feeder is connected to a second contactor configured for selectively connecting the first HVDC feeder to an HVDC bus. A second HVDC feeder is connected to a third contactor configured for selectively connecting the positive terminal of the HVDC source to the second HVDC feeder. The second HVDC feeder is connected to a fourth contactor configured for selectively connecting the second HVDC feeder to the HVDC bus. A third HVDC feeder is connected to a fifth contactor configured for selectively connecting a negative terminal of the HVDC source to the third HVDC feeder. The third HVDC feeder is connected to a sixth contactor configured for selectively connecting the third HVDC feeder to the HVDC bus. A fourth HVDC feeder is connected to a seventh contactor configured for selectively connecting the negative terminal of the HVDC source to the fourth HVDC feeder, wherein the fourth HVDC feeder is connected to an eighth contactor configured for selectively connecting the fourth HVDC feeder to the HVDC bus.

The HVDC source can be operatively connected to the first contactor, to the third contactor, to the fifth contactor, and to the seventh contactor. The HVDC bus can be operatively connected to the second contactor, to the fourth contactor, to the sixth contactor, and to the eighth contactor.

A power converter can be operatively connected to the HVDC bus to receive HVDC power from the HVDC bus and to output AC power. An electric machine can be operatively connected to the converter to be powered in a motor mode by the AC power from the power converter. The power converter can have a generator mode wherein the electric machine provides AC power to the power converter, which can provide HVDC power to the HVDC bus for charging an HVDC source through the first HVDC feeder, through the second HVDC feeder, through the third HVDC feeder, and through the fourth HVDC feeder. The power converter can be operatively connected to control each of the first contactor, the second contactor, the third contactor, the fourth contactor, the fifth contactor, the sixth contactor, the seventh contactor, and the eighth contactor to control connections between the HVDC source and the HVCD bus.

A first sensor package can be operatively connected to generate feedback indicative of voltage and/or current in the first feeder. A second sensor package can be operatively connected to generate feedback indicative of voltage and/or current in the second feeder. A third sensor package can be operatively connected to generate feedback indicative of voltage and/or current in the third feeder. A fourth sensor package can be operatively connected to generate feedback indicative of voltage and/or current in the fourth feeder. The first sensor package, the second sensor package, the third sensor package, and the fourth sensor package can be operatively connected to the power converter to provide feedback to the power converter. The power converter can be configured to use the feedback to locate a fault when a fault arises, and to isolate the fault by opening of the first contactor, the second contactor, the third contactor, the fourth contactor, the fifth contactor, the sixth contactor, the seventh contactor, and the eighth contactor as needed for continued operation of as many of the first feeder, the second feeder, the fourth feeder, and the fourth feeder as possible after clearing the fault.

The first feeder and the second feeder can be positive HVDC feeders. Isolating the fault can include isolating only one of the positive HVDC feeders from the HVDC bus and from the HVDC source for continued operation of the remaining one of the positive HVDC feeders in the event of one of the positive HVDC feeders faulting to ground. The third feeder and the fourth feeder can be negative HVDC feeders. Isolating the fault can include isolating one of the negative HVDC feeders from the HVDC bus and from the HVDC source for continued operation of the remaining one of the negative HVDC feeders in the event of one of the negative HVDC feeders faulting to ground. In the event of one of the positive HVDC feeders faulting in a short circuit with one of the negative HVDC feeders, isolating the fault can include isolating only one of the positive HVDC feeders from the HVDC bus and from the HVDC source, and isolating only one of the negative HVDC feeders from the HVDC bus and from the HVDC source for continued operation of the remaining positive and negative HVDC feeders.

A method includes receiving feedback indicative of a fault among two positive HVDC feeders and two negative HVDC feeders operatively connected between an HVDC source and an HVDC bus and using the feedback to locate the fault. The method includes opening contactors to isolate the fault, and continuing operation of as many of the positive HVDC feeders and the negative HVDC feeders as possible after isolating the fault.

These and other features of the systems and methods of the subject disclosure will become more readily apparent to those skilled in the art from the following detailed description of the preferred embodiments taken in conjunction with the drawings.

BRIEF DESCRIPTION OF THE DRAWINGS

So that those skilled in the art to which the subject disclosure appertains will readily understand how to make and use the devices and methods of the subject disclosure without undue experimentation, preferred embodiments thereof will be described in detail herein below with reference to certain figures, wherein.

DETAILED DESCRIPTION OF THE PREFERRED EMBODIMENTS

Figure 1:
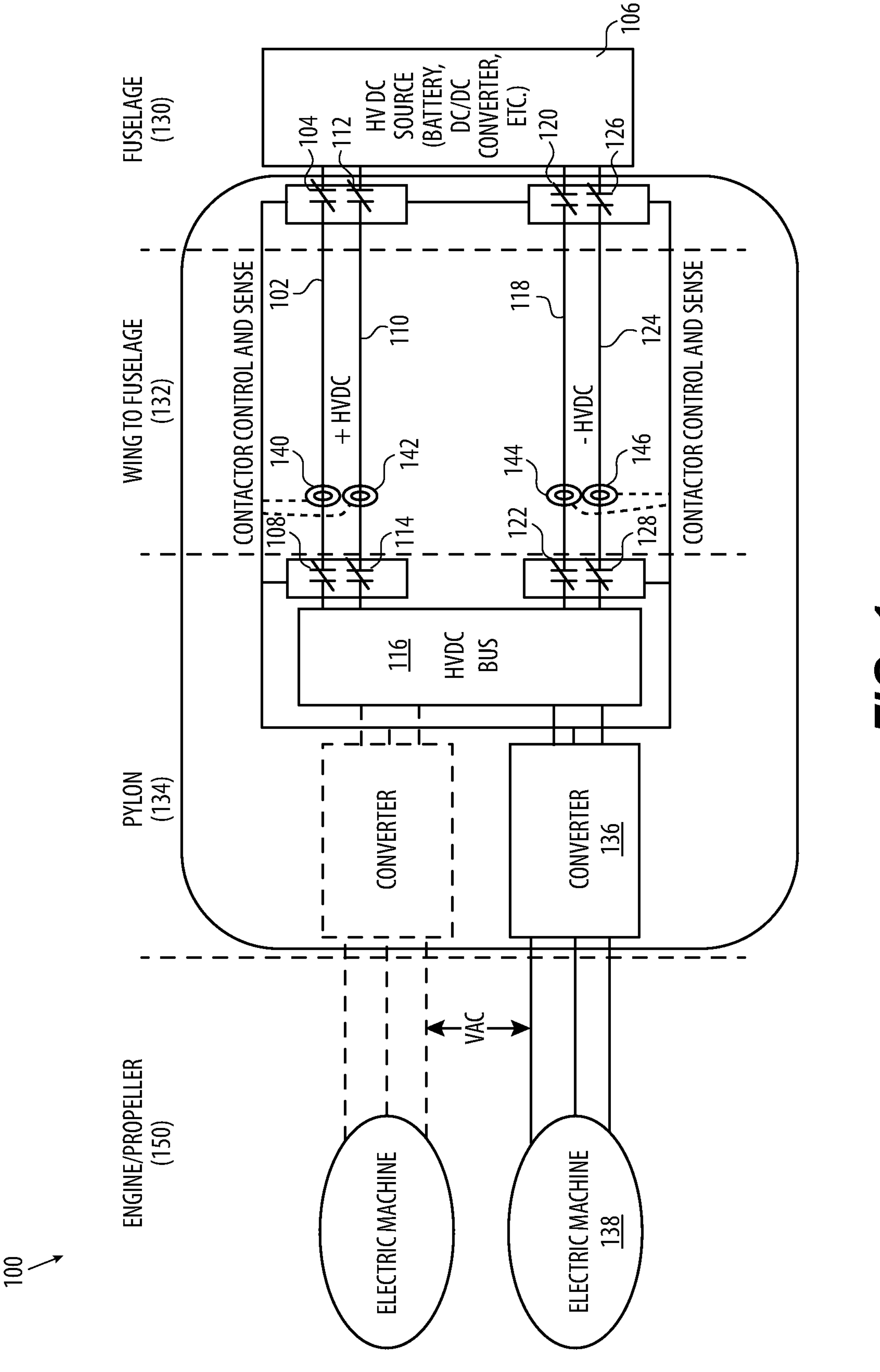
FIG. 1 is a schematic view of an embodiment of a system constructed in accordance with the present disclosure, showing the high voltage DC (HVDC) feeders and their contactors.

Reference will now be made to the drawings wherein like reference numerals identify similar structural features or aspects of the subject disclosure. For purposes of explanation and illustration, and not limitation, a partial view of an embodiment of a system in accordance with the disclosure is shown in FIG. 1 and is designated generally by reference character 100. Other embodiments of systems in accordance with the disclosure, or aspects thereof, are provided in FIGS. 2-4, as will be described. The systems and methods described herein can be used to locate and isolate HVDC feeder faults while allowing ongoing operation, e.g. in an electric motor of an aircraft.

The system 100 includes a first high voltage direct current (HVDC) feeder 102 connected to a first contactor 104 configured for selectively connecting and disconnecting a positive terminal of an HVDC source 106 to the first HVDC feeder 102. The first HVDC feeder 102 is connected to a second contactor 108 configured for selectively connecting and disconnecting the first HVDC feeder 102 to an HVDC bus 116. A second HVDC feeder 110 is connected to a third contactor 112 configured for selectively connecting and disconnecting the positive terminal of the HVDC source 106 to the second HVDC feeder 110. The second HVDC feeder 110 is connected to a fourth contactor 114 configured for selectively connecting and disconnecting the second HVDC feeder 110 to the HVDC bus 116. A third HVDC feeder 118 is connected to a fifth contactor 120 configured for selectively connecting and disconnecting a negative terminal of the HVDC source 106 to the third HVDC feeder 118. The third HVDC feeder 118 is connected to a sixth contactor 122 configured for selectively connecting can disconnecting the third HVDC feeder 118 to the HVDC bus 106. A fourth HVDC feeder 124 is connected to a seventh contactor 126 configured for selectively connecting and disconnecting the negative terminal of the HVDC source 106 to the fourth HVDC feeder 124. The fourth HVDC feeder 124 is connected to an eighth contactor 128 configured for selectively connecting and disconnecting the fourth HVDC feeder 124 to the HVDC bus 116.

The HVDC source 106 can be a battery, DC/DC converter, AC/DC converter or the like, e.g. onboard an aircraft such as a battery in an aircraft fuselage 130. The contactors 104, 112, 120, 126 can be located in the fuselage 130. The feeders 102, 110, 118, 124 can be located in a wing to fuselage junction 132, and the contactors 108, 114, 122, 128 can be located in an on-wing pylon 134 with the HVDC bus 116.

A power converter 136, e.g. rectifying/inverting converter for running the electric machine 138 in a motor and/or generator mode, is connected to the HVDC bus 116 to receive HVDC power from the HVDC bus 116 and to output AC power to the electric machine 136 in a motor mode. Optionally, one or more additional power converters and electric machines can be included in parallel with converter 136 and electric machine 138 as indicated in FIG. 1 with broken lines. The electric machine 138 can be located, for example in an engine or propeller/fan unit 150 for example. In a generator mode, the converter 136 can convert AC power from the electric machine 138 into HVDC power, which can be used to supply, e.g. charge, the HVDC source 106 through the feeders 102, 110, 118, 124. The power converter 136 is operatively connected as a controller to control each of the contactors 104, 108, 112, 114, 120, 122, 126, 128 to control connections between the HVDC source 106 and the HVCD bus 116. The power converter 136 is also operatively connected to receive feedback from a respective voltage and current detecting sensor package 140, 142, 144, 146 connected for monitoring voltage and current in each of the feeders 102, 110, 118, 124. The power converter is configured to use the feedback to locate a fault in the feeders 102, 110, 118, 124 when a fault arises, and to isolate the fault by opening certain of the contactors 104, 108, 112, 114, 120, 122, 126, 128 as needed for continued operation of as many of the feeders 102, 110, 118, 124 as possible after clearing the fault.

Figures 2, 3, 4:
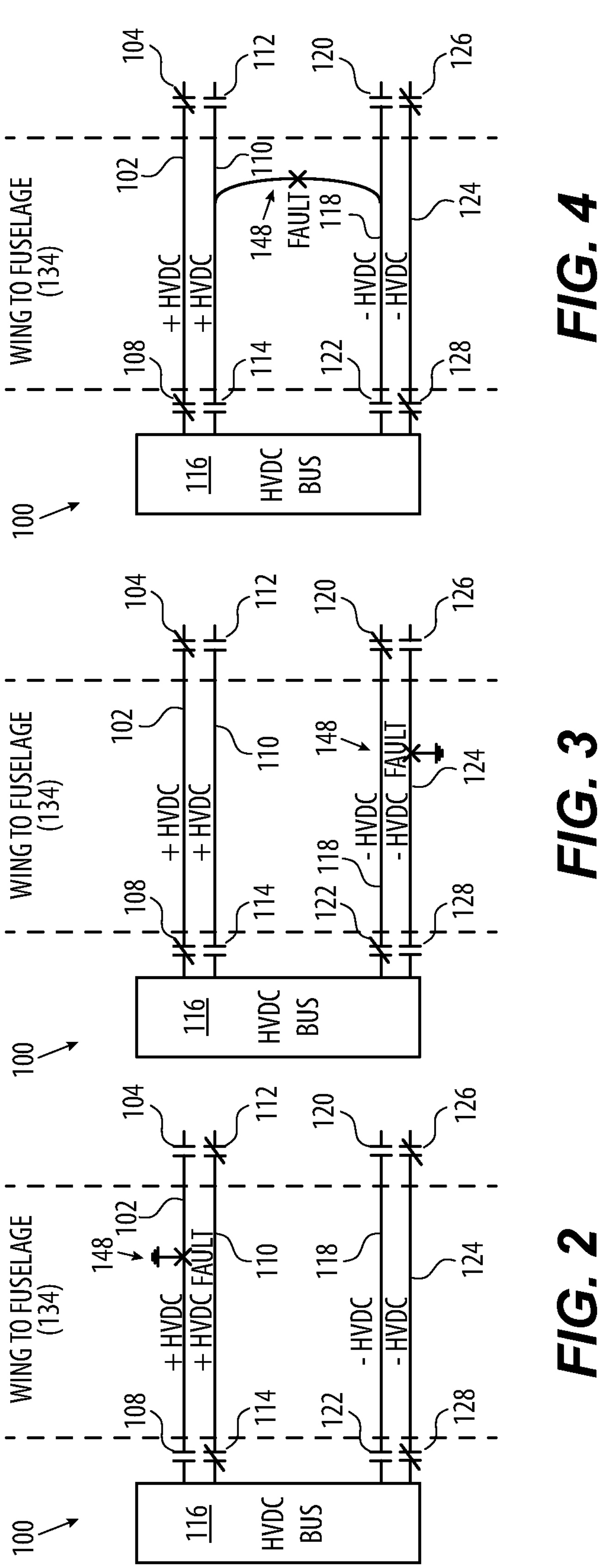
FIG. 2 is a schematic view of a portion of the system of FIG. 1, showing isolation of a ground fault in one of the positive HVDC feeders.
FIG. 3 is a schematic view of a portion of the system of FIG. 1, showing isolation of a ground fault in one of the negative HVDC feeders.
FIG. 4 is a schematic view of a portion of the system of FIG. 1, showing isolation of a short circuit fault of one of the positive HVDC feeders with one of the negative HVDC feeders.

With reference now to FIGS. 2-3, various fault modes can be detected and isolated while allowing continued operation of at least some of the feeders 102, 110, 118, 124. In FIG. 2, the fault 148 is a ground fault in one of the positive HVDC feeders 102, 110. Isolating the fault 148 in this case includes isolating only one of the positive HVDC feeders, e.g. feeder 102 as shown in FIG. 2, from the HVDC bus 116 and from the HVDC source 106 by opening the contactors 104, 108, 120, 122. The remaining contactors 112, 114, 126, 128 remain closed for continued operation of the remaining one of the positive HVDC feeders, e.g. feeder 110, as well as continued operation of of the negative HVDC feeders 124. Notice in FIG. 2 that contactors 120 and 122 open as well. Even though there is no fault on this feeder 118, the contactors 120, 122 will be opened to keep the impedance characteristics of the feeder pair 110, 124 balanced. Plus, the type of contactor used may be a double pole single throw (2PST) contactor, so the non-faulted feeder will be opened anyway. This applies similarly to FIGS. 3 and 4. In FIG. 3 the fault 148 is a ground fault of one of the negative HVDC feeders, e.g. feeder 124. In this case, isolating the fault 148 includes isolating the ground faulted feeder, e.g. feeder 124, by opening its contactors 112, 114, 126, 128, and leaving the rest of the contactors 104, 108, 120, 122 closed for continued operation of the remaining one of the negative HVDC feeders, e.g. feeder 118, as well as continued operation of the positive HVDC feeder 102. As shown in FIG. 4, in the event that the fault 148 is of one of the positive HVDC feeders, e.g. feeder 110, faulting in a short circuit with one of the negative HVDC feeders, e.g. feeder 118, the fault can be isolated by includes isolating the two faulted feeders, e.g. feeders 110, 118, by disconnecting their contactors, e.g. contactors 112, 114, 120, 122. This allows for continued operation of the remaining positive and negative HVDC feeders, e.g. feeders 102, 124 by leaving their contactors 104, 108, 126, 128 closed. Those skilled in the art having had the benefit of this disclosure will readily understand how to apply the protection shown in FIG. 4 to all of the other permutations of feeder-to-feeder faults possible, e.g. feeder 102 faulting to feeder 124.

With reference again to FIG. 1, in a general sense, the converter 136 can receive feedback indicative of a fault 148 (labeled in FIGS. 2-4) among the HVDC feeders 102, 110, 118, 124. The converter 136 can use that feedback to locate the fault 148 (labeled in FIGS. 2-4). The method includes the converter 136 opening some of the contactors 104, 108, 112, 114, 120, 122, 126, 128 to isolate the fault 148 (labeled in FIGS. 2-4), and leaving others of the contactors 104, 108, 112, 114, 120, 122, 126, 128 closed for continuing operation of as many of the non-faulting HVDC feeders 102, 110, 118, 124 as possible after isolating the fault 148 (labeled in FIGS. 2-4). Depending on the voltage and current ratings of the feeders 102, 110, 118, 124, the continued operation may need to be able to support full power generation capabilities and derated motoring performance (e.g. half torque).

Occurrence of a line to line or ground fault on the upstream source of an HVDC system typically requires the source to be fully isolated from the HVDC Bus. By using multiple parallel feeders with isolation detection incorporated, the failed feeder can be isolated to allow the system to continue safe operation, even if there is a fault on another feeder. Feeders can be sized/rated for reduced current since they are paralleled, allowing minimal increase of weight versus traditional single feeder configurations.

The methods and systems of the present disclosure, as described above and shown in the drawings, provide for locating and isolating HVDC feeder faults while allowing ongoing operation, e.g. in an electric motor of an aircraft. While the apparatus and methods of the subject disclosure have been shown and described with reference to preferred embodiments, those skilled in the art will readily appreciate that changes and/or modifications may be made thereto without departing from the scope of the subject disclosure.

What is claimed is:

1. A system comprising:

a first high voltage direct current (HVDC) feeder connected to a first contactor configured to selectively connect a positive terminal of an HVDC source to the first HVDC feeder, wherein the first HVDC feeder is connected to a second contactor configured to selectively connect the first HVDC feeder to an HVDC bus;

a second HVDC feeder connected to a third contactor configured to selectively connect the positive terminal of the HVDC source to the second HVDC feeder, wherein the second HVDC feeder is connected to a fourth contactor configured to selectively connect the second HVDC feeder to the HVDC bus;

a third HVDC feeder connected to a fifth contactor configured to selectively connect a negative terminal of the HVDC source to the third HVDC feeder, wherein the third HVDC feeder is connected to a sixth contactor configured to selectively connect the third HVDC feeder to the HVDC bus;

a fourth HVDC feeder connected to a seventh contactor configured to selectively connect the negative terminal of the HVDC source to the fourth HVDC feeder, wherein the fourth HVDC feeder is connected to an eighth contactor configured to selectively connect the fourth HVDC feeder to the HVDC bus; and a power converter connected to the HVDC bus and configured to (i) receive HVDC power from the HVDC bus and output alternating current (AC) power, (ii) receive AC power from an electric machine and provide HVDC power to the HVDC bus to charge the HVDC source through the first, second, third, and fourth HVDC feeders, and (iii) receive feedback indicative of a fault among the first, second, third, and fourth HVDC feeders;

wherein the power converter represents a rectifying/inverting converter that has (i) a generator mode in which the power converter is configured to receive the AC power from the electric machine and (ii) a motor mode in which the power converter is configured to provide the AC power to the electric machine; and wherein the power converter is configured to use the feedback to locate and isolate the fault by controlling opening of the first contactor, the second contactor, the third contactor, the fourth contactor, the fifth contactor, the sixth contactor, the seventh contactor, and the eighth contactor for continued operation of as many of the first HVDC feeder, the second HVDC feeder, the third HVDC feeder, and the fourth HVDC feeder as possible after clearing the fault.

2. The system as recited in claim 1, further comprising the HVDC source operatively connected to the first contactor, to the third contactor, to the fifth contactor, and to the seventh contactor.

3. The system as recited in claim 1, further comprising the HVDC bus operatively connected to the second contactor, to the fourth contactor, to the sixth contactor, and to the eighth contactor.

4. The system as recited in claim 1, further comprising the electric machine operatively connected to the power converter.

5. The system as recited in claim 4, wherein the HVDC source is one of a DC/DC converter, AC/DC converter, and a battery.

6. The system as recited in claim 1, wherein the power converter is operatively connected to control each of the first contactor, the second contactor, the third contactor, the fourth contactor, the fifth contactor, the sixth contactor, the seventh contactor, and the eighth contactor to control connections between the HVDC source and the HVDC bus.

7. The system as recited in claim 1, further comprising:

a first sensor package configured to generate feedback indicative of voltage and/or current in the first HVDC feeder;

a second sensor package configured to generate feedback indicative of voltage and/or current in the second HVDC feeder;

a third sensor package configured to generate feedback indicative of voltage and/or current in the third HVDC feeder; and a fourth sensor package configured to generate feedback indicative of voltage and/or current in the fourth HVDC feeder;

wherein the first sensor package, the second sensor package, the third sensor package, and the fourth sensor package are configured to provide the feedback indicative of the fault among the first, second, third, and fourth HVDC feeders to the power converter.

8. The system as recited in claim 7, wherein:

the first HVDC feeder and the second HVDC feeder are positive HVDC feeders; and the power converter is configured to isolate the fault by isolating only one of the positive HVDC feeders from the HVDC bus and from the HVDC source for continued operation in response to one of the positive HVDC feeders faulting to ground.

9. The system as recited in claim 7, wherein:

the third HVDC feeder and the fourth HVDC feeder are negative HVDC feeders; and the power converter is configured to isolate the fault by isolating one of the negative HVDC feeders from the HVDC bus and from the HVDC source for continued operation in response to one of the negative HVDC feeders faulting to ground.

10. The system as recited in claim 7, wherein:

the third HVDC feeder and the fourth HVDC feeder are negative HVDC feeders;

the first HVDC feeder and the second HVDC feeder are positive HVDC feeders; and the power converter is configured to isolate the fault by isolating only one of the positive HVDC feeders from the HVDC bus and from the HVDC source and isolating only one of the negative HVDC feeders from the HVDC bus and from the HVDC source for continued operation in response to the one of the positive HVDC feeders faulting in a short circuit with the one of the negative HVDC feeders.

11. The system as recited in claim 1, wherein:

the HVDC source is located within a fuselage of an aircraft;

the first, second, third, and fourth HVDC feeders are located in a wing-to-fuselage junction of the aircraft; and the power converter and the HVDC bus are located within an on-wing pylon of the aircraft.

12. A method comprising:

converting, using a power converter, alternating current (AC) power from an electric machine to high voltage direct current (HVDC) power;

providing, by the power converter, the HVDC power to an HVDC bus to charge an HVDC source through two positive HVDC feeders and two negative HVDC feeders operatively connected between the HVDC source and the HVDC bus;

receiving, by the power converter, feedback indicative of a fault among the two positive HVDC feeders and the two negative HVDC feeders;

using the feedback to locate the fault;

opening, by the power converter, contactors to isolate the fault; and continuing operation of as many of the positive HVDC feeders and the negative HVDC feeders as possible after isolating the fault;

wherein the power converter represents a rectifying/inverting converter that has (i) a generator mode in which the power converter receives the AC power from the electric machine and (ii) a motor mode in which the power converter provides the AC power to the electric machine.

13. The method as recited in claim 12, wherein receiving the feedback includes receiving feedback indicative of voltage and/or current in each of the positive HVDC feeders and in each of the negative HVDC feeders.

14. The method as recited in claim 12, wherein:

if the fault is a fault to ground in one of the positive HVDC feeders, isolating the fault includes isolating only the one of the positive HVDC feeders from the HVDC bus and from the HVDC source for continued operation of a remaining one of the positive HVDC feeders; and if the fault is a fault to ground in one of the negative HVDC feeders, isolating the fault includes isolating only the one of the negative HVDC feeders from the HVDC bus and from the HVDC source for continued operation of a remaining one of the negative HVDC feeders.

15. The method as recited in claim 12, wherein, if the fault is a short circuit fault of one of the positive HVDC feeders to one of the negative HVDC feeders, isolating the fault includes isolating the one of the positive HVDC feeders from the HVDC bus and from the HVDC source and isolating the one of the negative HVDC feeders from the HVDC bus and from the HVDC source for continued operation of a remaining one of the positive HVDC feeders and a remaining one of the negative HVDC feeders.

16. An apparatus comprising:

a power converter configured to:

receive high voltage direct current (HVDC) power from an HVDC bus and output alternating current (AC) power;

receive AC power from an electric machine and provide HVDC power to the HVDC bus to charge an HVDC source through two positive HVDC feeders and two negative HVDC feeders operatively connected between the HVDC source and the HVDC bus;

receive feedback indicative of a fault among the two positive HVDC feeders and the two negative HVDC feeders;

use the feedback to locate the fault;

open contactors to isolate the fault; and continue operation of as many of the positive HVDC feeders and the negative HVDC feeders as possible after isolating the fault;

wherein the power converter represents a rectifying/inverting converter that has (i) a generator mode in which the power converter is configured to receive the AC power from the electric machine and (ii) a motor mode in which the power converter is configured to provide the AC power to the electric machine.

17. The apparatus as recited in claim 16, wherein the feedback comprises feedback indicative of voltage and/or current in each of the positive HVDC feeders and in each of the negative HVDC feeders.

18. The apparatus as recited in claim 16, wherein:

the power converter is configured, if the fault is a fault to ground in one of the positive HVDC feeders, to isolate only the one of the positive HVDC feeders from the HVDC bus and from the HVDC source for continued operation of a remaining one of the positive HVDC feeders; and the power converter is configured, if the fault is a fault to ground in the one of the negative HVDC feeders, to isolate only the one of the negative HVDC feeders from the HVDC bus and from the HVDC source for continued operation of a remaining one of the negative HVDC feeders.

19. The apparatus as recited in claim 16, wherein the power converter is configured, if the fault is a short circuit fault of one of the positive HVDC feeders to one of the negative HVDC feeders, to isolate the one of the positive HVDC feeders from the HVDC bus and from the HVDC source and to isolate the one of the negative HVDC feeders from the HVDC bus and from the HVDC source for continued operation of a remaining one of the positive HVDC feeders and a remaining one of the negative HVDC feeders.

20. The apparatus as recited in claim 16, wherein the power converter is located within an on-wing pylon of an aircraft with the HVDC bus.

* * * * *